United States Patent [19]
Eklund

[11] Patent Number: 4,811,075
[45] Date of Patent: Mar. 7, 1989

[54] HIGH VOLTAGE MOS TRANSISTORS
[75] Inventor: Klas H. Eklund, Los Gatos, Calif.
[73] Assignee: Power Integrations, Inc., Mountain View, Calif.
[21] Appl. No.: 41,994
[22] Filed: Apr. 24, 1987
[51] Int. Cl.[4] .................. H01L 27/02; H01L 29/78; H01L 29/80
[52] U.S. Cl. ........................ 357/46; 357/22; 357/23.4; 357/23.8
[58] Field of Search ............ 357/23.8, 23.4, 46, 357/22

[56] References Cited
U.S. PATENT DOCUMENTS
4,626,879 12/1986 Colak ............................ 357/23.8
4,628,341 12/1986 Thomas ........................ 357/23.8

OTHER PUBLICATIONS
Sze, *Physics of Semiconductor Devices* Wiley & Sons N.Y. c. 1981 pp. 431–438, 486–491.

Primary Examiner—Andrew J. James
Assistant Examiner—Jerome Jackson
Attorney, Agent, or Firm—Thomas E. Schatzel

[57] ABSTRACT

An insulated-gate, field-effect transistor and a double-sided, junction-gate field-effect transistor are connected in series on the same chip to form a high-voltage MOS transistor. An extended drain region is formed on top of a substrate of opposite conductivity-type material. A top layer of material having a conductivity-type opposite that of the extended drain and similar to that of the substrate is provided by ion-implantation through the same mask window as the extended drain region. This top layer covers only an intermediate portion of the extended drain which has ends contacting a silicon dioxide layer thereabove. The top layer is either connected to the substrate or left floating. Current flow through the extended drain region can be controlled by the substrate and the top layer, which act as gates providing field-effects for pinching off the extended drain region therebetween. A complementary pair of such high-voltage MOS transistors having opposite conductivity-type are provided on the same chip.

7 Claims, 2 Drawing Sheets

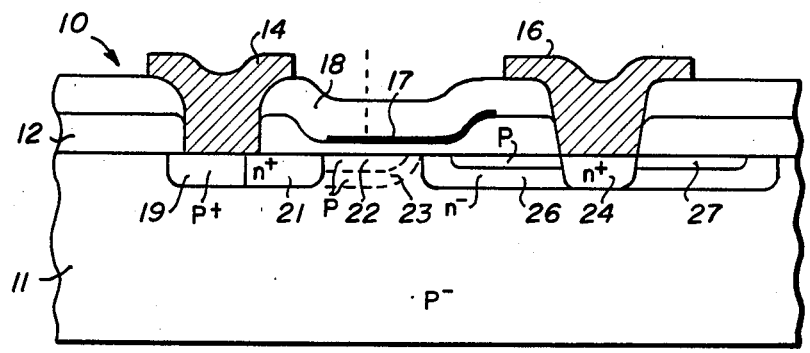
Fig._1
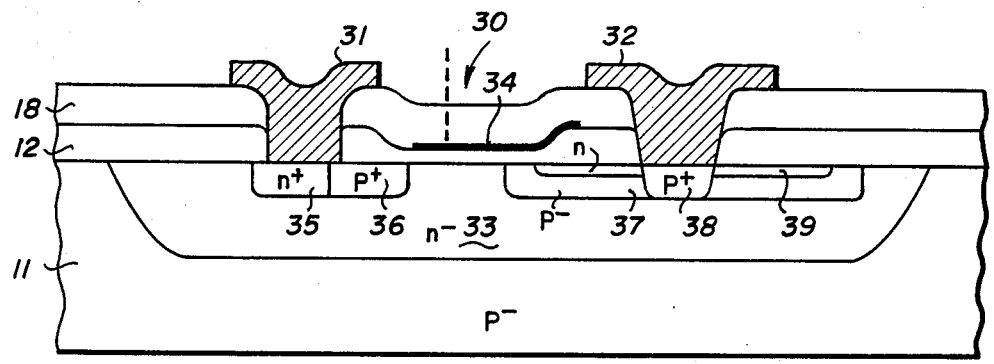
Fig._2
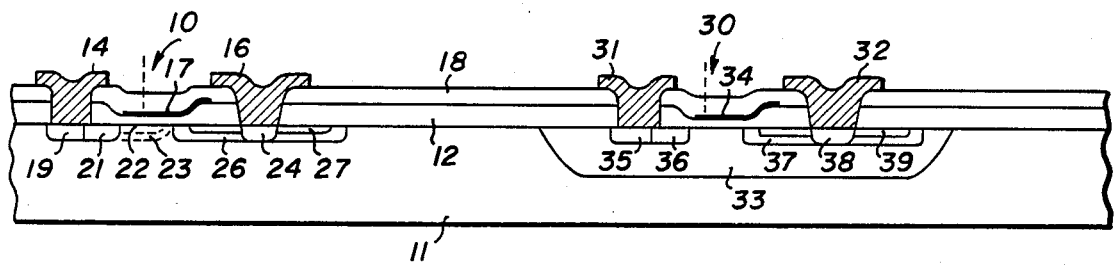
Fig._3

HIGH VOLTAGE MOS TRANSISTORS

BACKGROUND OF THE INVENTION

1. Field of the Invention

This invention relates generally to high voltage metal-oxide semiconductor (MOS) transistors of the field-effect type. More specifically, the transistors can be made as either discrete or integrated devices of either n-channel or p-channel conductivity. The integrated devices can easily be combined with low voltage control logic on the same chip. Further devices of opposite conductivity can be combined in a complementary manner on the same chip.

2. Description of the Prior Art

Self isolation technology is used for making high voltage MOS devices, particularly integrated high voltage devices in combination with low voltage control logic on the same chip. The voltage is sustained by an offset gate, as a lightly doped extended drain region is used. Such devices can be considered as an IGFET or MOSFET in series with a single sided JFET. Two of such high voltage devices having opposite conductivity types can be used as a complementary pair on the same chip, with the device having an extended p-type drain being imbedded in an n-well in a p-substrate.

The voltage capability of such high voltage devices is determined by the doping of the substrate, the length of the extended drain region and the net number of charges therein. For optimum performance, the net number of charges should be around $1 \times 10^{12}/cm^2$. Such devices have been used for making display drivers in the one hundred to two hundred volt range, but the current capabilities of the devices are poor. The main advantage is that low voltage control logic easily can be combined on the same chip. For these devices, a general figure of merit can be determined by the product of $R_{on}xA$ (where $R_{on}$ is the on-resistance in the linear region and A is the area taken up by the device). For an n-channel device in the voltage range of two hundred fifty to three hundred volts, $R_{on}xA$ is typically 10–15 $\Omega$ mm². A discrete vertical D-MOS device in the same voltage range has a figure of merit of 3 $\Omega$ mm², but is much more difficult to combine with low voltage control logic on the same chip. Thus, the application of these high voltage devices is restricted to current level below 100 mA, such as display drivers. Even such drivers are more costly due to poor area efficiency of the high voltage devices.

SUMMARY OF THE PRESENT INVENTION

An object of the present invention is to provide a more efficient high voltage MOS transistor.

Another object of the invention is to provide a high voltage MOS transistor that is compatible with five volt logic.

A further object of the invention is to provide a three hundred volt n-channel device with a figure of merit, $R_{on}$ x A, of about 2.0 $\Omega$ mm², Briefly, the present invention includes an insulated gate, field-effect transistor (IGFET or MOSFET) and a double-sided junction gate field-effect transistor (JFET) connected in series on the same chip to form a high voltage MOS transistor. In a preferred embodiment of the invention, a complementary pair of such high voltage MOS transistors having opposite conductivity type are provided on the same chip.

Advantages of the invention include more efficient high voltage MOS transistors, compatibility with five volt logic, and for an n-channel device, voltage capability of three hundred volts with a figure of merit, $R_{on}$ x A, of about 2.0 $\Omega$ mm².

These and other objects and advantages of the present invention will no doubt become obvious to those of ordinary skill in the art after having read the following detailed description of the preferred embodiments which are illustrated in the various drawing figures.

IN THE DRAWINGS

FIG. 1 is a diagrammatic view of a high voltage MOS transistor of the n-channel type embodying the present invention.

FIG. 2 is a diagrammatic view of a high voltage MOS transistor of the p-channel type embodying the present invention.

FIG. 3 is a diagrammatic view of the transistors shown in FIGS. 1 and 2 forming a complementary pair on the same chip.

FIG. 5 is a diagrammatic view of a symmetric high-voltage n-channel device wherein the source region and the drain region are similar.

DESCRIPTION OF THE PREFERRED EMBODIMENT

Figure 4:
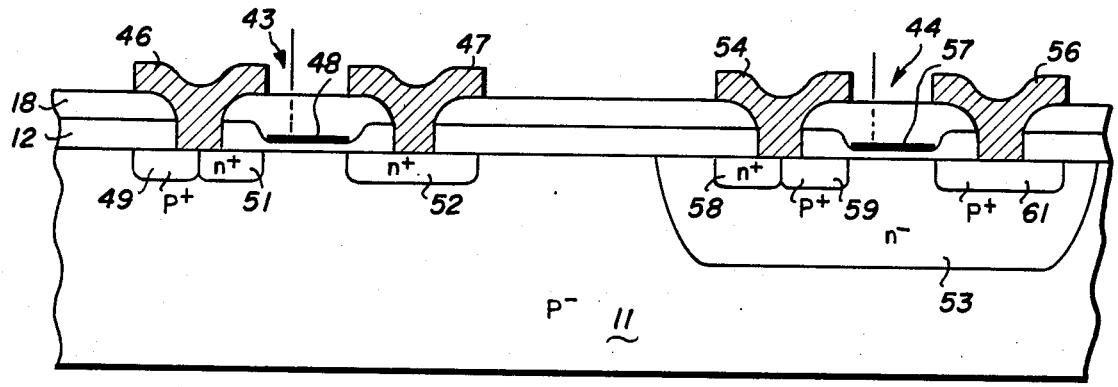
FIG. 4 is a diagrammatic view of low voltage, C-MOS implemented devices that can be combined on the same chip with the complementary pair of high voltage MOS transistors shown in FIG. 3.

Looking now at FIG. 1, an n-channel type, high voltage MOS transistor, indicated generally by reference numeral 10, is formed on a p-substrate 11 covered by a silicon dioxide layer 12. A metal source contact 14 and a metal drain contact 16 extend through the silicon dioxide layer to the substrate. A polysilicon gate 17 is positioned between the source contact and the drain contact at a location where the silicon dioxide layer is very thin so that the gate is slightly offset and insulated from the substrate. The polysilicon gate is the gate electrode, and an insulation layer 18 covers the gate and the silicon dioxide layer.

Beneath the source contact 14, a pocket 19 of p+ material and a pocket 21 of n+ material are diffused into the p⁻ substrate 11. The pocket 21 extends from beneath the source contact to the gate 17. Beneath the gate is a threshold voltage implant 22 of p-type material for adjusting the threshold voltage and a punch through implant 23 of p-type material for avoiding punch through voltage breakdown. Beneath the drain contact 16, a pocket 24 of n+ material is diffused into the substrate. An extended drain region 26 of n-material is formed by diffusion or ion implantation on top of the p-substrate, and extends from beneath gate 17 to the pocket 24 and a similar distance to the opposite side of the pocket. A top layer 27 of p- material is provided by ion-implantation through the same mask window as the extended drain region to cover an intermediate portion thereof, while the end portions of the drain region are uncovered to contact the silicon dioxide layer 12. The top layer is either connected to the substrate or left floating.

The gate 17 controls by field-effect the current flow thereunder laterally through the p-type material to the n-type material in the extended drain region 26. Further flow through the extended drain region can be controlled by the substrate 11 and the top layer 27, which act as gates providing field-effects for pinching off the extended drain region therebetween. Thus, the transistor 10 can be considered as an insulated gate, field-effect transistor (IGFET or MOSFET) connected in series with a double-sided, junction-gate field-effect transistor (JFET). While the insulated gate, field-effect transistor shown is a conventional MOS type, it should be understood that it could also be a lateral D-MOS or a depletion MOS type.

By adding the top layer 27 over the extended drain region 26 and connecting this top layer to the substrate 11, the net number of charges in the extended drain region can be increased from $1 \times 10^{12}/cm^2$ to around $2 \times 10^{12}/cm^2$, or approximately double. This drastically reduces the on-resistance of the transistor 10. The pinch off voltage of the extended drain region can be reduced from typically around forty volts to below ten volts. Thus, a conventional short channel, thin gate oxide MOS transistors can be used as the series transistor instead of a D-MOS device. This results in the following benefits. First, the threshold voltage of a conventional MOS transistor is typically much lower than for a D-MOS device (0.7 volts compared to two four volts for the D-MOS device) and thus, is directly compatible with five volt logic. The D-MOS device usually requires an additional power supply of ten to fifteen volts for driving the gate. Second, the conventional MOS transistor has less on resistance and thus, further reduces the total on resistance.

As the p-type top layer 27 can be made very shallow with a depth of one micron or less, the doping density in that layer will be in the range of $5 \times 10^{16}-1 \times 10^{17}/cm^3$. At doping levels above $10^{16}/cm^3$, the mobility starts to degrade and a decrease in mobility will increase the critical electrical field for breakdown, thus giving a higher breakdown voltage for fixed geometry. The number of charges in the top layer is around $1 \times 10^{12}/cm^2$ and to first order approximation independent of depth.

The combined benefits of the above features result in a voltage capability of three hundred volts with a figure of merit, $R_{on}$ x A, of about 2.0 $\Omega$ mm$^2$ for the transistor 10. Currently used integrated MOS transistors have a figure of merit of about 10–15 $\Omega$ mm$^2$, while the best discrete vertical D-MOS devices on the market in a similar voltage range have a figure of merit of 3–4 $\Omega$ mm$^2$.

With reference to FIG. 2, a p-channel type, high voltage MOS transistor is indicated generally by reference numeral 30. Since the layers of substrate, silicon dioxide, and insulation for this transistor are similar to those previously described for transistor 10, they will be given like reference numerals. A p-substrate 11 is covered by a silicon dioxide layer 12 and an insulation layer 18. A metal source contact 31 and a metal drain contact 32 extend through the insulation layer and the silicon dioxide layer to an n-well 33 that is embedded in the substrate. A polysilicon gate 34, which is an electrode, is positioned between the source contact and the drain contact at a location where the silicon dioxide layer is very thin so that the gate is slightly offset and insulated from the n-well. The gate and the silicon dioxide layer are covered by the insulation layer 18.

A pocket 35 of n+ type material and a pocket 36 of p+ type material are provided in the n-well 33 beneath the metal source contact 31. The pocket 36 extends to the gate 34. An extended drain region 37 of p-type material is formed in the n-well and extends from beneath the gate to a pocket 38 located beneath the drain contact 32, and the extended drain region continues a similar distance on the opposite side of the drain contact. A top layer 39 of n-material is provided by ion-implantation through the same window of the mask as the extended drain region to cover an intermediate portion thereof. The end portions of the extended drain region are uncovered so as to contact the silicon dioxide layer 12. The top layer is either connected to the n-well or left floating.

The gate 34 controls by field-effect the current flow thereunder laterally through the n-type material to the p-type material in the extended drain region 37. Further flow through the extended drain region can be controlled by the n-well 33 and the top layer 39, which act as gates providing field-effects for pinching off the extended drain region therebetween. Thus, the transistor 30 can be considered as an insulated-gate field-effect transistor (IGFET or MOSFET) connected in series with a double-sided, junction-gate field-effect transistor (JFET). The n-well under the extended drain region has to be depleted before breakdown occurs between the p+ drain contact pocket 38 and the n-well.

Looking now at FIG. 3, an n-channel transistor 10, similar to that shown in FIG. 1, and a p-channel transistor 30, similar to that shown in FIG. 2, are shown as a complementary pair on the same substrate 11 and isolated from each other. Since the details of each transistor has been previously described with reference to FIGS. 1 and 2, no further description is considered necessary.

As shown in FIG. 4, low voltage, C-MOS implemented devices 43 and 44 can be combined on the same p-substrate 11 as the high voltage devices 10 and 30, shown in FIG. 3. These low voltage devices enable low voltage logic and analog function to control the high voltage devices. The device 43 is an n-channel type having a source contact 46, a drain contact 47 and a polysilicon gate 48. A p+ pocket 49 and an n+ pocket 51 are provided in the p− substrate beneath the source contact. The n+ pocket extends to beneath the gate. An n+ pocket 52 is provided beneath the drain contact. The gate 48 is insulated from the substrate by the silicon dioxide layer 12, but the gate controls the current flow through the substrate between pockets 51 and 52. The gate is covered by the insulation layer 18. An n-well 53 is provided in the substrate to accommodate the low voltage, p-channel device 44. This device includes a source contact 54, a drain contact 56 and a polysilicon gate 57. An n+ pocket 58 and a p+ pocket 59 are provided in the n-well beneath the source contact and a p+ pocket 61 is provided in the n-well beneath the drain contact. The gate 57 is insulated from the n-well and extends thereabove between pockets 59 and 61.

It should be noted that the term "substrate" refers to the physical material on which a microcircuit is fabricated. If a transistor is fabricated on a well of n or p type material within a primary substrate of opposite type material, the well material can be considered a secondary substrate. Similarly, if a transistor is fabricated on an epitaxial layer or spi-island that merely supports and insulates the transistor, the epitaxial layer or epi-island can be considered a secondary substrate. An epi-island is a portion of an epitaxial layer of one conductivity type that is isolated from the remaining portion of the epitaxial layer by diffusion pockets of an opposite conductivity type. When complimentary transistors are formed on the same chip, the well in which one complimentary transistor is embedded is formed by the same diffusion as the extended drain region for the other transistor.

Figure 5:
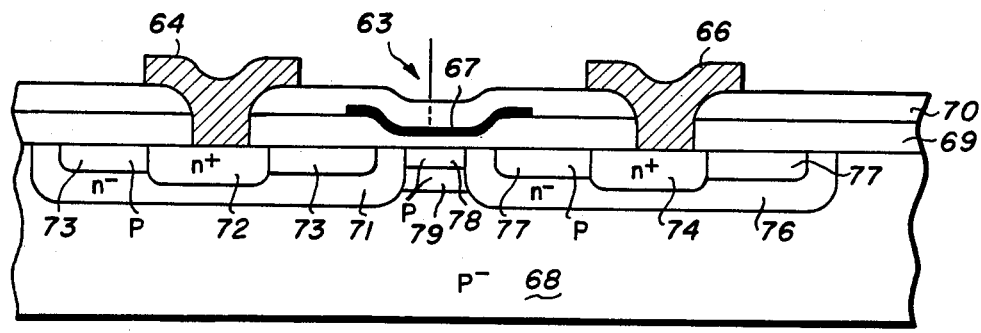

FIG. 5 shows a symmetrical n-channel device 63 having a source contact 64 and a drain contact 66. A polysilicon gate 67 is insulated from a substrate 68 by a silicon dioxide layer 69 and the gate is covered by an insulation layer 20. An n-type extended source region 71 is provided beneath the source contact and an n+ type pocket 72. A top layer 73 of p-type material is positioned over an intermediate portion of the extended source region, while the end portions of the extended source region contact the silicon dixode layer thereabove. Beneath the drain contact is an n+ type pocket 74 and an n-type extended drain region 76. A top layer 73 of p-type material is positioned over an intermediate portion of the extended drain region and end portions of the extended drain region contact the silicon dioxide layer. An implant 78 of the p-type material is provided under the gate 67 between the extended source region and the extended drain region for sustaining the threshold voltage. A similar implant 79 for sustaining the punch-through voltage is provided beneath the implant 78. Since the symmetrical channel device has both an extended source an an extended drain, the source can sustain the same high potential as the drain. A symmetric p-channel device could be made in a similar way using opposite conductivity type materials.

From the foregoing description, it will be seen that an efficient, high voltage MOS transistor has been provided. This transistor is compatible with five volt logic which easily can be integrated on the same chip. The transistor has a voltage capability of three hundred volts for an n-channel device, and has a figure of merit, $R_{on} \times A$, of about 2.0 $\Omega mm^2$. The transistor is formed by an insulated-gate field-effect transistor and a double-sided junction-gate field-effect transistor connected in series on the same chip. These transistors can be made as either discrete devices or integrated devices of either n-channel or p-channel conductivity. The integrated devices can be easily combined with low voltage control logic on the same chip. Further devices of opposite conductivity can be combined in a complementary manner on the same chip.

Although the present invention has been described in terms of the presently preferred embodiment, it is to be understood that such disclosure is not to be interpreted as limiting. Various alterations and modifications will no doubt become apparent to those of ordinary skill in the art after having read the above disclosure. Accordingly, it is intended that the appended claims be interpreted as covering all alterations and modifications as fall within the true spirit and scope of the invention.

I claim:

1. A high voltage MOS transistor comprising:
a semiconductor substrate of a first conductivity type having a surface
a pair of laterally spaced pockets of semiconductor material of a second conductivity type within the substrate and adjoining the substrate surface,
a source contact connected to one pocket,
a drain contact connected to the other pocket,
an extended drain region of the second conductivity type extending laterally each way from the drain contact pocket to surface-adjoining positions,
a surface adjoining layer of material of the first conductivity type on top of an intermediate portion of the extended drain region between the drain contact pocket and the surface-adjoining positions,
said top layer of material and said substrate being subject to application of a reverse-bias voltage,
an insulating layer on the surface of the substrate and covering at least that portion between the source contact pocket and the nearest surface-adjoining position of the extended drain region, and
a gate electrode on the insulating layer and electrically isolated from the substrate region thereunder which forms a channel laterally between the source contact pocket and the nearest surface-adjoining position of the extended drain region, said gate electrode controlling by field-effect the flow of current thereunder through the channel.

2. The high-voltage MOS transistor of claim 1 wherein,
said top layer has a depth of one micron or less.

3. The high-voltage MOS transistor of claim 1 wherein,
said top layer has a doping density higher than $5 \times 10^{16}/cm^3$ so that the mobility starts to degrade.

4. The high voltage MOS transistor of claim 1 having one channel conductivity type in combination with a complementary high voltage MOS transistor of an opposite channel conductivity type combined on the same chip and isolated from each other.

5. The high voltage MOS transistor of claim 1 combined on the same chip with a low voltage CMOS implemented device.

6. The combination of claim 5 further including,
a complementary high voltage MOS transistor, and
a complementary low voltage CMOS implemented device on the same chip and isolated from each other.

7. A high voltage MOS transistor comprising:
a semiconductor substrate of a first conductivity type having a surface,
a pair of laterally spaced pockets of semiconductor material of a second conductivity type within the substrate and adjoining the substrate surface,
a source contact connected to one pocket,
an extended source region of the second conductivity type extending laterally each way from the source contact pocket to surface-adjoining positions,
a surface adjoining layer of material of the first conductivity type on top of an intermediate portion of the extended source region between the surface-adjoining positions,
said top layer and said substrate being subject to application of a reverse-bias voltage,
a drain contact connected to the other pocket,
an extended drain region of the second conductivity type extending laterally each way from the drain contact pocket to surface-adjoining positions,
a surface adjoining layer of material of the first conductivity type on top of an intermediate portion of the extended drain region between the drain contact pocket and the surface-adjoining positions,
said top layer of material and said substrate being subject to application of a reverse-bias voltage,
an insulating layer on the surface of the substrate and covering at least that portion between the nearest surface-adjoining positions of the extended source region and the extended drain region, and
a gate electrode on the insulating layer and electrically isolated from the substrate region thereunder which forms a channel laterally between the nearest surface-adjoining positions of the extended source region and the extended drain region, said gate electrode controlling by field-effect the current flow thereunder through the channel.

* * * * *